United States Patent
Lee et al.

(10) Patent No.: US 12,119,241 B2
(45) Date of Patent: Oct. 15, 2024

(54) UNIT FOR SUPPLYING SUBSTRATE TREATING LIQUID AND APPARATUS FOR TREATING SUBSTRATE INCLUDING THE SAME

(71) Applicant: SEMES CO., LTD., Chungcheongnam-do (KR)

(72) Inventors: Dong Hwa Lee, Chungcheongnam-do (KR); Dai Geon Yoon, Chungcheongnam-do (KR); Soo Hong Lee, Gyeonggi-do (KR); Ji Hyeon Kim, Chungcheongnam-do (KR); Dae Sung Kim, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 0 days.

(21) Appl. No.: 17/879,012

(22) Filed: Aug. 2, 2022

(65) Prior Publication Data
US 2023/0068426 A1 Mar. 2, 2023

(30) Foreign Application Priority Data
Aug. 24, 2021 (KR) ........................ 10-2021-0111469

(51) Int. Cl.
*B41J 2/165* (2006.01)
*H01L 21/67* (2006.01)

(52) U.S. Cl.
CPC .... *H01L 21/67051* (2013.01); *B41J 2/16517* (2013.01); *H01L 21/67253* (2013.01)

(58) Field of Classification Search
CPC .... B41J 2/04513; B41J 2/04581; B41J 29/20; B41J 2/165; B41J 2/16579; B41J 2/16517; B41J 2/195
See application file for complete search history.

(56) References Cited

U.S. PATENT DOCUMENTS 8,534,807 B2   9/2013  Hoisington et al.
8,820,899 B2   9/2014  Hoisington et al.
(Continued)

FOREIGN PATENT DOCUMENTS

EP   2 093 065   8/2009
JP   2011-520671  7/2011
(Continued)

OTHER PUBLICATIONS

Office Action dated Jul. 28, 2023 for Korean Patent Application No. 10-2021-0111469 and its English translation from Global Dossier.
(Continued)

*Primary Examiner* — Kristal Feggins
(74) *Attorney, Agent, or Firm* — Womble Bond Dickinson (US) LLP

(57) ABSTRACT

A unit for supplying a substrate-treating liquid is provided with a first reservoir and a second reservoir between which a differential pressure is constantly maintained to establish a flow rate, along with a substrate-treating apparatus having the unit for supplying the substrate-treating liquid. The unit for supplying the substrate-treating liquid includes a supply reservoir module and a buffer reservoir module. The supply reservoir module includes a first reservoir for supplying the substrate-treating liquid to an inkjet head unit for jetting the substrate-treating liquid onto a substrate, and a second reservoir for recovering the substrate-treating liquid that remains unused in the inkjet head unit. The buffer reservoir module is configured to provide the substrate-treating liquid to the first reservoir. Differential pressure is constantly maintained between the first reservoir and the second reservoir.

19 Claims, 6 Drawing Sheets

(56) References Cited

U.S. PATENT DOCUMENTS

| | | |
|---|---|---|
| 10,065,428 B2 | 9/2018 | Ohtsu et al. |
| 10,737,502 B2 | 8/2020 | Goto et al. |
| 11,135,853 B1 | 10/2021 | Yu |
| 11,338,587 B2 | 5/2022 | Goto et al. |
| 2022/0388308 A1 | 12/2022 | Nakatani et al. |

FOREIGN PATENT DOCUMENTS

| | | |
|---|---|---|
| JP | 2017-193081 | 10/2017 |
| JP | 2019-59046 | 4/2019 |
| JP | 2020-192692 | 12/2020 |
| JP | 2021-70313 | 5/2021 |
| KR | 10-0915376 | 9/2009 |
| KR | 10-2019-0047834 | 5/2019 |
| KR | 10-2194622 | 12/2020 |
| KR | 10-2232661 | 3/2021 |

OTHER PUBLICATIONS

Office Action dated Aug. 1, 2023 for Japanese Patent Application No. 2022-130389 and its English translation from Global Dossier.

UNIT FOR SUPPLYING SUBSTRATE TREATING LIQUID AND APPARATUS FOR TREATING SUBSTRATE INCLUDING THE SAME

CROSS-REFERENCE TO RELATED APPLICATION

This application claims priority from Korean Patent Application No. 10-2021-0111469 filed on Aug. 24, 2021, in the Korean Intellectual Property Office, and all the benefits accruing therefrom under 35 U.S.C. 119, the contents of which in its entirety are herein incorporated by reference.

BACKGROUND

1. Technical Field

The present disclosure relates to a unit for supplying a substrate-treating liquid and a substrate-treating apparatus having the unit for supplying the substrate-treating liquid. More particularly, the present disclosure relates to a substrate-treating liquid supply unit for providing a substrate-treating liquid to an inkjet head unit for jetting the liquid onto a substrate, and a substrate-treating apparatus having the substrate-treating liquid supply unit.

2. Description of the Related Art

When performing a printing process, e.g., RGB patterning on a transparent substrate to manufacture a display device such as a liquid crystal display (LCD) panel, a plasma display panel (PDP), or a light-emitting diode (LED) panel, the process may utilize printing equipment having an inkjet head unit.

SUMMARY

An inkjet head unit may be used to perform jetting ink onto a substrate. In general, a substrate treating apparatus having such an inkjet head unit can supply ink to the inkjet head unit by using a single reservoir, and use a pump to send ink remaining unused in the inkjet head unit to be stored back in the reservoir.

However, the flow rate of ink circulation may affect the jetting quality of the inkjet head unit to unqualify the substrate-treating apparatus as described above for use with high flow circulation. Therefore, an additional method is required to prevent the precipitation of particles in the ink.

Aspects of the present disclosure provide a unit for supplying a substrate-treating liquid with a first reservoir and a second reservoir between which a differential pressure is constantly maintained to establish a flow rate, along with a substrate-treating apparatus having the unit for supplying the substrate-treating liquid.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a unit for supplying a substrate treating liquid, including a supply reservoir module and a buffer reservoir module. The supply reservoir module includes a first reservoir configured to supply the substrate-treating liquid to an inkjet head unit configured to jet the substrate-treating liquid onto a substrate, and a second reservoir configured to recover the substrate-treating liquid that remains unused in the inkjet head unit. The buffer reservoir module is configured to provide the substrate-treating liquid to the first reservoir. Differential pressure is constantly maintained between the first reservoir and the second reservoir.

The unit for supplying the substrate-treating liquid may further include a first line connecting the first reservoir and the inkjet head unit, a second line connecting the inkjet head unit and the second reservoir, and a third line connecting the first reservoir and the second reservoir.

The third line may be configured to move a flow rate corresponding to the differential pressure between the first reservoir and the second reservoir.

The substrate-treating liquid passing through the third line may have a flow rate that is different from the flow rate of the substrate-treating liquid passing through the first line and/or the second line.

The flow rate of the substrate-treating liquid passing through the third line may be greater than the flow rate of the substrate-treating liquid passing through the first line and/or the second line.

The substrate-treating liquid passing through the third line may have a flow rate that is variable.

The differential pressure may include a differential head between the first reservoir and the second reservoir.

The differential pressure initially may supply the substrate-treating liquid to the first reservoir and the second reservoir and may be followed by an application of negative pressure to form different pressures in the first reservoir and the second reservoir.

The first reservoir may be provided at an even elevation with the second reservoir, and the buffer reservoir module may be provided above the first reservoir and/or the second reservoir.

The unit for supplying the substrate-treating liquid may further include a circulation control module configured to cause the substrate-treating liquid recovered to the second reservoir to be circulated and re-supplied to the first reservoir.

The circulation control module may include a pump configured to circulate the substrate-treating liquid from the second reservoir to the first reservoir, a flow meter configured to measure the flow rate of the substrate-treating liquid when circulated, and a filter configured to filter the substrate-treating liquid when circulated.

The circulation control module may be provided with a pressure that is variable.

The pressure provided to the circulation control module may be variable based on the water level information of the second reservoir or may be variable based on a ratio between the water level information of the first reservoir and the water level information of the second reservoir.

The circulation control module may include a water level measurement sensor configured to measure water level information, wherein the water level measurement sensor may be installed in the second reservoir, or installed in both the first reservoir and the second reservoir.

The circulation control module may include a pressure controller module configured to independently control the pressure of the first reservoir and the pressure of the second reservoir.

According to another aspect of the present disclosure, there is provided a unit for supplying a substrate-treating liquid, including a supply reservoir module including (1) a first reservoir configured to supply the substrate-treating liquid to an inkjet head unit configured to jet the substrate-treating liquid onto a substrate, and (2) a second reservoir configured to recover the substrate-treating liquid that remains unused in the inkjet head unit, a buffer reservoir module configured to provide the substrate-treating liquid to the first reservoir, a circulation control module configured to cause the substrate-treating liquid recovered to the second reservoir to be circulated and re-supplied to the first reservoir, a first line connecting the first reservoir and the inkjet head unit, a second line connecting the inkjet head unit and the second reservoir, and a third line connecting the first reservoir and the second reservoir, wherein the third line is configured to move a flow rate corresponding to a differential pressure between the first reservoir and the second reservoir, and wherein a flow rate of the substrate-treating liquid passing through the third line is greater than a flow rate of the substrate-treating liquid passing through the first line and/or the second line.

According to yet another aspect of the present disclosure, there is provided an apparatus for treating a substrate, including an inkjet head unit configured to jet a substrate-treating liquid onto the substrate, and a unit for supplying the substrate-treating liquid to the inkjet head unit, wherein the unit for supplying the substrate-treating liquid includes a supply reservoir module including (1) a first reservoir configured to supply the substrate-treating liquid to the inkjet head unit, and (2) a second reservoir configured to recover the substrate-treating liquid that remains unused in the inkjet head unit, and a buffer reservoir module configured to provide the substrate-treating liquid to the first reservoir, wherein a differential pressure is constantly maintained between the first reservoir and the second reservoir.

The apparatus for treating a substrate may utilize quantum dot (QD) ink for the substrate-treating liquid.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
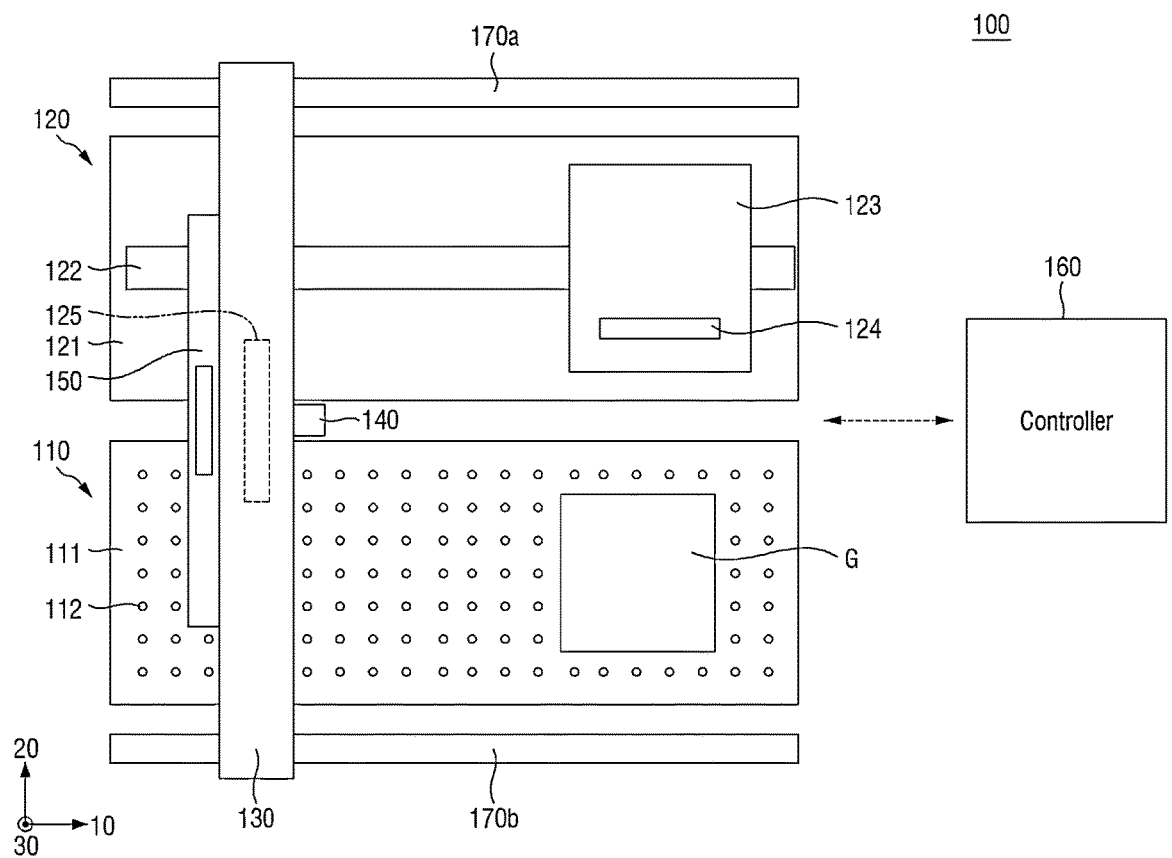
FIG. 1 is a schematic diagram of an internal structure of a substrate-treating apparatus according to at least one embodiment of the present disclosure.

Advantages and features of the present disclosure and methods of accomplishing the same may be understood more readily by reference to the following detailed description of exemplary embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the disclosure to those skilled in the art, and the present disclosure will only be defined by the appended claims. Like reference numerals refer to like elements throughout the specification.

It will also be understood that when an element or a layer is referred to as being "on" another element or layer, it can be not only directly on the other element or layer, but also indirectly thereon with intervening elements or layers being present. In contrast, when an element is referred to as being "directly on" another element, there are no intervening elements present.

Spatially relative terms, such as "below," "beneath," "lower," "above," "upper," and the like, may be used herein for ease of description to convey one element's or feature's relationship to another element(s) or feature(s) as illustrated in the drawings. It will be understood that the spatially relative terms are intended to encompass different orientations of the device in use or operation in addition to the orientation depicted in the drawings. For example, when a device in the drawings is turned over, elements described as "below" or "beneath" other elements or features would then be oriented "above" the other elements or features. Thus, the illustrative term "below" can encompass both an orientation of above and below. The device may be otherwise oriented (rotated 90 degrees or at other orientations), and the spatially relative descriptors used herein may be interpreted accordingly.

It will be understood that, although the terms first, second, etc. may be used herein to describe various elements, components, and/or sections, these elements, components, and/or sections should not be limited by these terms. These terms are only used to distinguish one element, component, or section from another element, component, or section. Thus, a first element, first component, or first section discussed below could be termed a second element, second component, or second section without departing from the teachings of the present disclosure.

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, some embodiments of the present disclosure will be described in detail with reference to the accompanying drawings. In the following description, like reference numerals designate like elements, although the elements are shown in different drawings. Further, in the following description of some embodiments, a detailed description of related known components and functions when considered to obscure the subject of the present disclosure will be omitted for the purpose of clarity and for brevity.

The present disclosure relates to a unit for supplying a substrate-treating liquid with a first reservoir and a second reservoir between which a differential pressure is constantly maintained to establish a flow rate, and to a substrate-treating apparatus having the unit for supplying the substrate-treating liquid. Hereinafter, the present disclosure will be described in detail with reference to drawings and the like.

FIG. 1 is a schematic diagram of an internal structure of a substrate-treating apparatus 100 according to at least one embodiment of the present disclosure.

According to FIG. 1, the substrate-treating apparatus 100 may be configured to include a process treatment unit 110, a maintenance unit 120, a gantry unit 130, an inkjet head unit 140, a substrate-treating liquid supply unit 150, and a controller 160.

The substrate-treating apparatus 100 is adapted to treat a substrate G (e.g., a glass substrate) used for manufacturing a display device. The substrate-treating apparatus 100 may be implemented as a printing facility for jetting a substrate-treating liquid onto the substrate G by using the inkjet head unit 140, and it may be implemented as a circulation system-type inkjet facility to prevent nozzle clogging by the substrate-treating liquid.

The process treatment unit 110 is adapted to support the substrate G during its printing treatment (PT) operation that is the printing treatment of the substrate G performed with the substrate-treating liquid. The process treatment unit 110 may support the substrate G in a non-contact method. The process treatment unit 110 may support the substrate G by levitating the same in the air by using, for example, air. However, the present embodiment is not limited thereto. The process treatment unit 110 may support the substrate G in a contact method. The process treatment unit 110 may support the substrate G by using, for example, a support member having a top seating surface.

The substrate-treating liquid in the above refers to a chemical solution used to print the substrate G. The substrate-treating liquid may be, for example, quantum dot (QD) ink including ultrafine semiconductor particles.

The process treatment unit 110 when using air to support the substrate G, may be configured to include a first stage 111 and air holes 112.

The first stage 111, which serves as a base, is provided to seat thereon the substrate G. The air holes 112 may be formed through the upper surface of the first stage 111, and they may be formed in the printing treatment (PT) zone on the first stage 111.

The air holes 112 may inject air in an upper direction (a third direction 30) of the first stage 111. This allows the air holes 112 to levitate the substrate G seated on the first stage 111.

Although not shown in FIG. 1, the process treatment unit 110 may further include a gripper. The gripper is for preventing the substrate G from being separated from the first stage 111 when the substrate G moves in the longitudinal direction (a first direction 10) of the first stage 111. The gripper can hold the substrate G to prevent it from being separated from the first stage 111, and when the substrate G moves, the gripper can slide along a guide rail (not shown) while holding the substrate G.

The maintenance unit 120 is adapted to make measurements of a jetting position (i.e., a plotting spot) of the substrate-treating liquid on the substrate G, whether the substrate-treating liquid is jetted, and the like. The maintenance unit 120 may make measurements of a jetting position of the substrate-treating liquid, whether or not the substrate-treating liquid is jetted, etc. for each of a plurality of nozzles provided in the inkjet head unit 140, and may render the thus obtained measurements to be provided to the controller 160.

The maintenance unit 120 may be configured to include, for example, a second stage 121, a third guide rail 122, a first plate 123, a calibration board 124, and a vision module 125.

As the first stage 111, the second stage 121 serves as a base and may be arranged in parallel with the first stage 111. The second stage 121 may be provided to have the same size as the first stage 111 but may be provided to have a size smaller or larger than that of the first stage 111. The second stage 121 may include an maintenance treatment (MT) zone thereon.

The third guide rail 122 serves as a travel path for guiding the travel of the first plate 123. The third guide rail 122 may be provided on the second stage 121 in at least one line along the longitudinal direction (first direction 10) of the second stage 121. The third guide rail 122 may be implemented as, for example, a linear motor (LM) guide system.

Although not shown in FIG. 1, the maintenance unit 120 may further include a fourth guide rail. As with the third guide rail 122, the fourth guide rail serves as a travel path for guiding the travel of the first plate 123 and is disposed on the second stage 121 in at least one line along the width direction (a second direction 20). The fourth guide rail may also be implemented as an LM guide system like the third guide rail 122.

The first plate 123 is adapted to move on the second stage 121 along the third guide rail 122 and/or the fourth guide rail. The first plate 123 may move in parallel with the substrate G along the third guide rail 122 and may move toward or away from the substrate G along the fourth guide rail.

The calibration board 124 is for measuring the jetting position of the substrate-treating liquid on the substrate (G). Such a calibration board 124 may be installed on the first plate 123, including an alignment mark, a ruler, etc., and may be provided along the longitudinal direction (first direction 10) of the first plate 123.

The vision module 125 obtains image information about the substrate G to make the measurements of the jetting position of the substrate-treating liquid and whether or not the substrate-treating liquid is jetted among others. The vision module 125 may include an area scan camera, a line scan camera, and the like, and may obtain image information on the substrate G in real-time. Meanwhile, the vision module 125 may obtain and provide information on the calibration board 124 as well as information on the substrate G on which the substrate-treating liquid is jetted.

The vision module 125 may be provided on a lateral side or lower side of the gantry unit 130 to photograph the substrate G and others. The vision module 125 may be installed, for example, to be attached to a side surface of the inkjet head unit 140. However, the present embodiment is not limited thereto. The vision module 125 may be provided on the first plate 123. Meanwhile, multiples of the vision module 125 may be provided in the substrate-treating apparatus 100, and they may be fixedly installed or movably installed.

The gantry unit 130 supports the inkjet head unit 140. The gantry unit 130 may be provided above the first stage 111 and the second stage 121 for allowing the inkjet head unit 140 to jet the substrate-treating liquid onto the substrate G.

Provided above the first stage 111 and the second stage 121, the gantry unit 130 may extend in its longitudinal direction (second direction 20) widthwise of the first stage 111 and the second stage 121. The gantry unit 130 may move in a longitudinal direction (first direction 10) of the first stage 111 and the second stage 121 along a first guide rail 170a and a second guide rail 170b. Here, the first guide rail 170a and the second guide rail 170b may be provided externally of and along the longitudinal direction (first direction 10) of the first stage 111 and the second stage 121.

Although not shown in FIG. 1, the substrate-treating apparatus 100 may further include a gantry-moving unit. The gantry-moving unit is adapted to move the gantry unit 130 along the first guide rail 170a and the second guide rail 170b. The gantry-moving unit may be installed inside the gantry unit 130 and may be configured to include a first moving module (not shown) and a second moving module (not shown). The first moving module and the second moving module may be provided at the opposite ends of and within the gantry unit 130, and may slidably move the gantry unit 130 along the first guide rail 170a and the second guide rail 170b.

The inkjet head unit 140 ejects the substrate-treating liquid in the form of droplets on the substrate G. The inkjet head unit 140 may be provided on the side of or below the gantry unit 130.

At least one inkjet head unit 140 may be installed in the gantry unit 130. When multiples of the inkjet head unit 140 are installed in the gantry unit 130, they may be arranged in a line along the longitudinal direction (second direction 20) of the gantry unit 130.

The inkjet head unit 140 may move along the longitudinal direction (second direction 20) of the gantry unit 130 to be positioned at the desired point on the substrate G. However, the present embodiment is not limited thereto. The inkjet head unit 140 may move along the height-direction (third direction 30) of the gantry unit 130, and may also rotate clockwise or counterclockwise.

Meanwhile, the inkjet head unit 140 may also be installed fixedly to the gantry unit 130. In this case, the gantry unit 130 may be provided to be movable.

Although not shown in FIG. 1, the substrate-treating apparatus 100 may further include an inkjet-head moving unit. The inkjet-head moving unit linearly moves or rotates the inkjet head unit 140. When the substrate-treating apparatus 100 is configured to include multiple inkjet head units 140, multiples of the inkjet-head moving unit may be provided in the substrate-treating apparatus 100 as many as the inkjet head units 140 to independently operate the multiple inkjet head units 140. On the other hand, a single inkjet-head moving unit may be provided in the substrate-treating apparatus 100 to uniformly operate the multiple inkjet head units 140.

Although not shown in FIG. 1, the inkjet head unit 140 may include a nozzle plate, a plurality of nozzles, a piezoelectric element, and the like. The nozzle plate constitutes the body of the inkjet head unit 140. A plurality of (e.g., 128, 256, etc.) nozzles may be provided in multiple rows and columns at regular intervals on the lower portion of the nozzle plate. Multiples of the piezoelectric element may be provided as many as the nozzles in the nozzle plate. When configured as described above, the inkjet head unit 140 may jet the substrate-treating liquid onto the substrate G through the nozzles according to the operation of the piezoelectric elements.

Here, the inkjet head unit 140 may independently control the discharge amounts of the substrate-treating liquid provided through the respective nozzles according to the voltages applied to the piezoelectric elements.

The substrate-treating liquid supply unit 150 is to supply ink to the inkjet head unit 140. This substrate-treating liquid supply unit 150 may be configured to include a storage tank and a pressure controller module.

The storage tank is to store the substrate-treating liquid, and the pressure controller module is to adjust the internal pressure of the storage tank. The storage tank may supply an appropriate amount of substrate-treating liquid to the inkjet head unit 140 based on the pressure provided by the pressure controller module.

The controller 160 causes maintenance to be performed on the inkjet head unit 140. The controller 160 may correct jetting positions of the substrate-treating liquid of the respective nozzles provided in the inkjet head unit 140 based on the measurements from the maintenance unit 120 or may cause a defective nozzle, i.e., nozzle incapable of jetting the substrate-treating liquid to be detected from among the multiple nozzles to render a cleaning operation to be performed on the defective nozzle. To this end, the controller 160 may control the operation of each component of the substrate-treating apparatus 100.

The controller 160 may be implemented by a computer, a server, or others, including a process controller, a control program, an input module, an output module (or a display module), a memory module, and the like. Here, the process controller may include a microprocessor that executes a control function for each component of the substrate-treating apparatus 100, and the control program may execute various processes of the substrate-treating apparatus 100 under the control of the process controller. The memory module stores programs, i.e., processing recipes for executing various processes of the substrate-treating apparatus 100 according to various data and processing conditions.

Although not shown in FIG. 1, the substrate-treating apparatus 100 may further include a nozzle inspection unit. The nozzle inspection unit is for determining whether there is an abnormality with respect to each of the nozzles installed in the inkjet head unit 140. The nozzle inspection unit may determine whether the nozzle is abnormal by using, for example, an optical inspection.

The substrate-treating liquid supply unit 150 is conventionally provided with a single storage tank to supply ink to the inkjet head unit 140 and may circulate the ink between the inkjet head unit 140 and the storage tank to prevent precipitation of particles in the ink.

However, the substrate-treating apparatus of this structure is not suitable for high-flow circulation. The present embodiment can resolve this deficiency by providing the substrate-treating liquid supply unit 150 with a first reservoir and a second reservoir, between which a constant differential pressure is established to form a flow rate.

Figure 2:
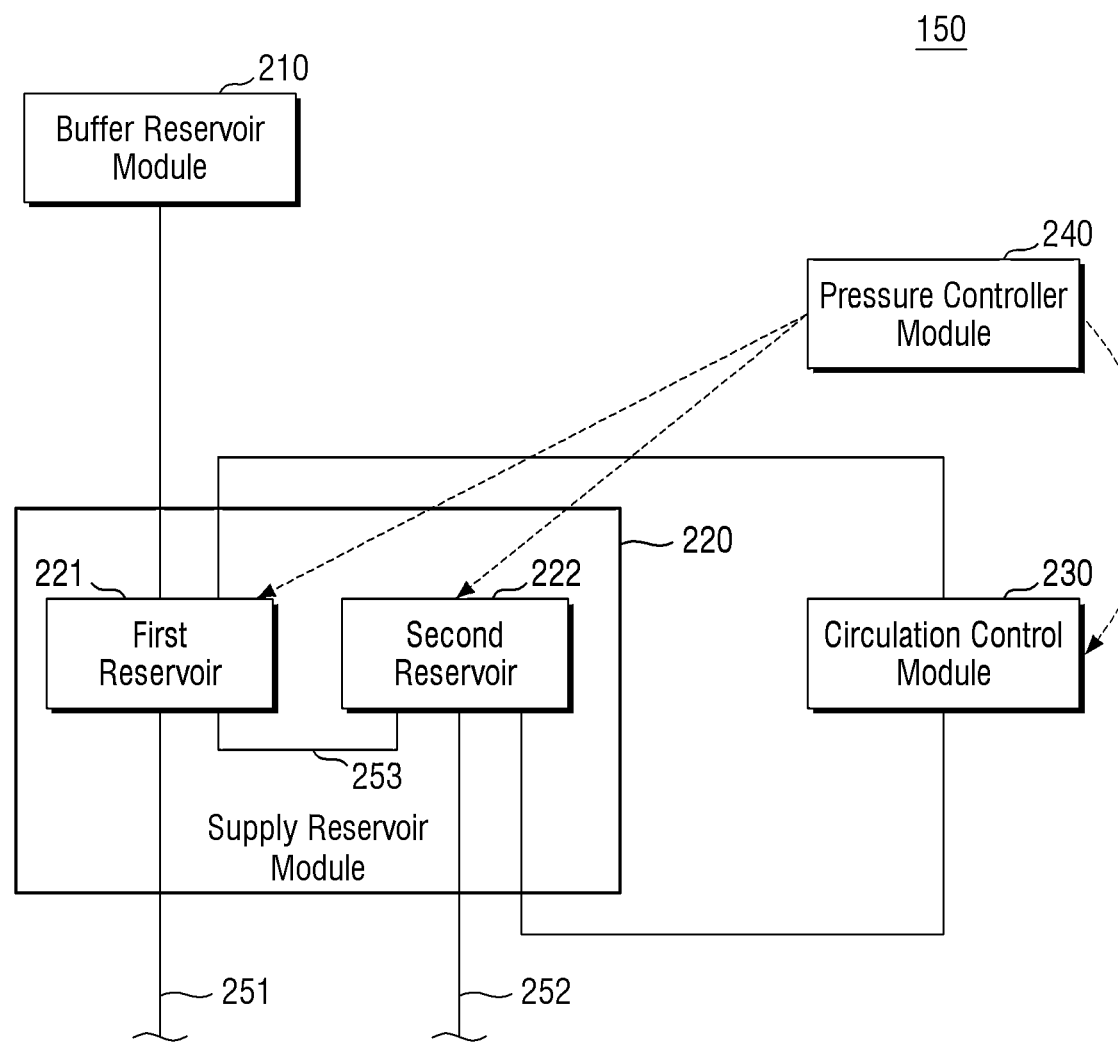
FIG. 2 is a schematic diagram of an internal structure of a substrate-treating liquid supply unit constituting a substrate-treating apparatus according to at least one embodiment of the present disclosure.
Figure 3:
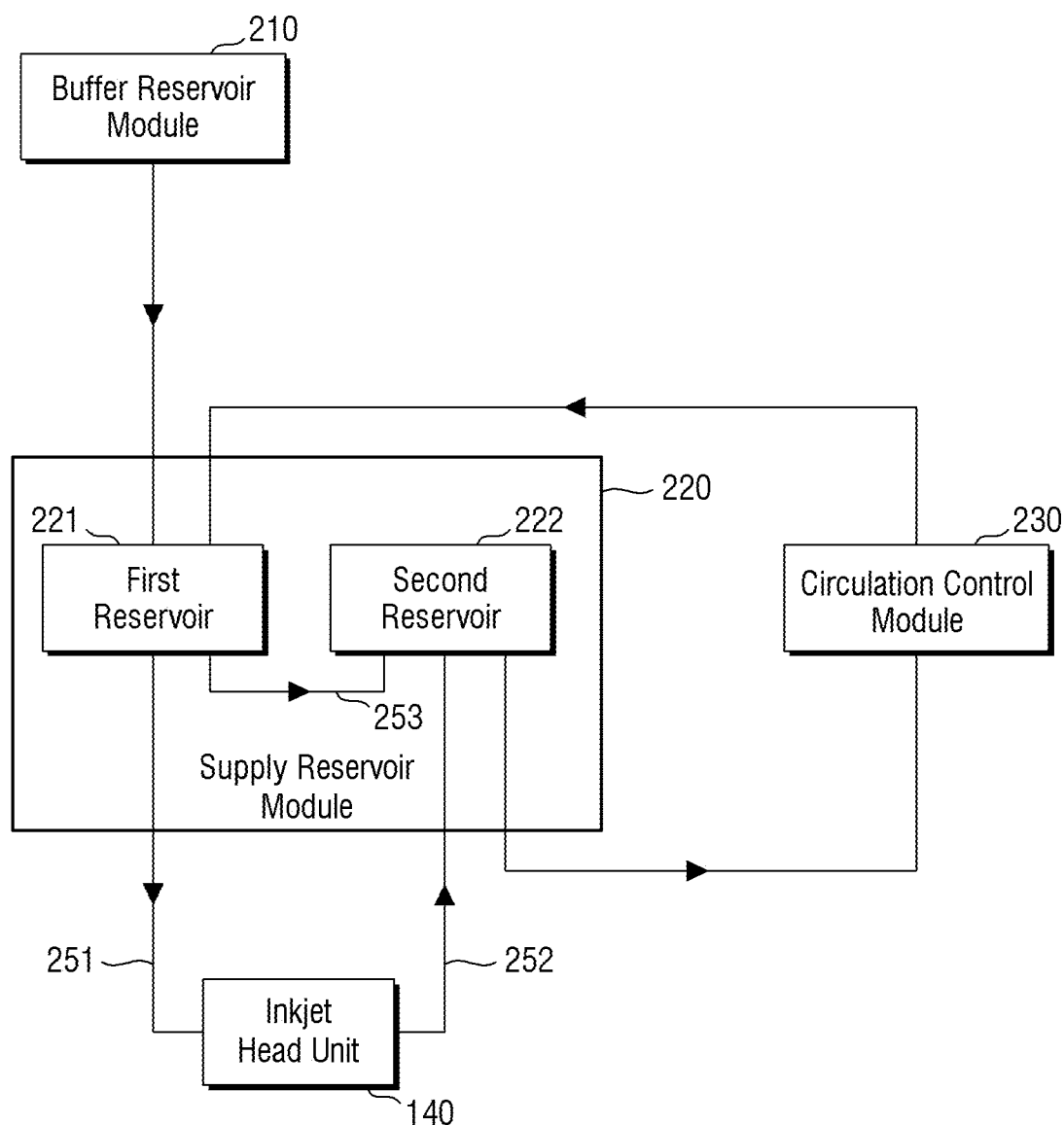
FIG. 3 is a diagram of a movement path of ink in the substrate-treating liquid supply unit constituting the substrate-treating apparatus according to at least one embodiment of the present disclosure.

FIG. 2 a schematic diagram of an internal structure of a substrate-treating liquid supply unit 150 constituting a substrate-treating apparatus according to at least one embodiment of the present disclosure. FIG. 3 is a diagram of a movement path of ink in the substrate-treating liquid supply unit 150 constituting the substrate-treating apparatus according to at least one embodiment of the present disclosure.

According to FIGS. 2 and 3, the substrate-treating liquid supply unit 150 may be configured to include a buffer reservoir module (BRM) 210, a supply reservoir module (SRM) 220, a circulation control module 230, and a pressure controller module (PCM) 240.

The buffer reservoir module 210 receives and stores ink from an external ink supply source (not shown). The buffer reservoir module 210 is disposed above the supply reservoir module 220 and serves to fill the supply reservoir module 220 with ink.

The supply reservoir module 220 stores the ink supplied from the buffer reservoir module 210. The supply reservoir module 220 provides ink to the inkjet head unit 140 which may then jet the provided ink onto the substrate G.

The supply reservoir module 220 may include a first reservoir 221 and a second reservoir 222. Here, the first reservoir 221 may be a feed reservoir that supplies ink to the inkjet head unit 140, and the second reservoir 222 may be a recovery reservoir or drain reservoir that recovers ink that remains unused in the inkjet head unit 140. Alternatively, the first reservoir 221 may be a drain reservoir, and the second reservoir 222 may be a feed reservoir.

The following description assumes that the first reservoir 221 is a feed reservoir and the second reservoir 222 is a drain reservoir, as an example.

The first reservoir 221 may be connected to the inkjet head unit 140 through a first line 251. The first reservoir 221 may supply ink to the inkjet head unit 140 through the first line 251. The first line 251 may be a supply line.

The second reservoir 222 may be connected to the inkjet head unit 140 through the second line 252. The second reservoir 222 may recover unused ink from the inkjet head unit 140 through the second line 252. The second line 252 may be a recovery line or drain line.

The first reservoir 221 may be connected to the second reservoir 222 through a third line 253. In this embodiment, to maintain a constant differential pressure between the first reservoir 221 and the second reservoir 222, the third line 253 may be used to transfer the ink by a flow rate corresponding to the differential pressure from the first reservoir 221 to the second reservoir 222. The third line 253 may be a bypass line.

The ink is circulated to form a flow of ink from the first reservoir 221 to the second reservoir 222 with the differential pressure established between the first reservoir 221 and the second reservoir 222. In this case, the flow rate of the ink passing through the third line 253 may be different from that of the ink passing through the first line 251 and/or the second line 252. For example, the third line 253 may be set as the main circulation path of the ink while the first line 251 and/or the second line 252 may be set as the secondary circulation path of the ink, resulting in a greater flow rate of the ink passes through the main circulation path than the ink passing through the secondary circulation path.

When the third line 253, which is directly connected between the first reservoir 221 and the second reservoir 222, is configured as a bypass line in this way, a low flow rate can be maintained by the ink when supplied from the first reservoir 221 through the first line 251 to the inkjet head unit 140, while a high flow rate can be maintained by the ink when recovered from the inkjet head unit 140 through the second line 252 to the second reservoir 222.

Therefore, the present embodiment configures the supply reservoir module 220 as a differential-pressure reservoir module or difference reservoir module (DRM) to prevent ink from being deposited in the nozzles of the inkjet head unit 140 and thereby prolong the lifespan of the inkjet head unit 140.

Meanwhile, in the above, the differential pressure between the first reservoir 221 and the second reservoir 222 may be a differential head between the ink stored in the first reservoir 221 and the ink stored in the second reservoir 222.

On the other hand, the flow rate of ink moving from the first reservoir 221 to the second reservoir 222 through the third line 253 may be variable according to the differential pressure between the first reservoir 221 and the second reservoir 222.

The circulation control module 230 transfers the ink that has been transferred to the second reservoir 222 due to non-use in the inkjet head unit 140 back to the first reservoir 221. The circulation control module 230 may be configured as shown in FIG. 4 to include a pump 231, a flow meter 232, and a filter 233, and it may be implemented as, for example, a pump filter unit (PFU).

Figure 4:
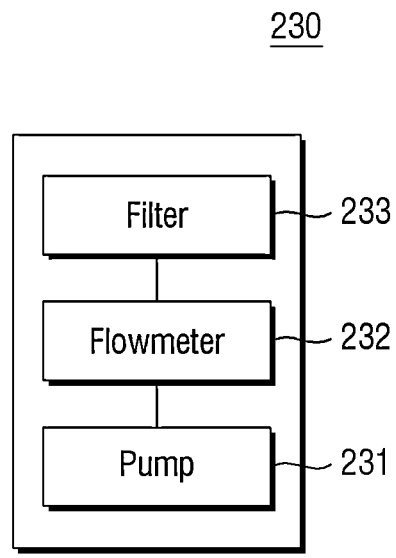
FIG. 4 is a schematic diagram of an internal configuration of a circulation control module constituting the substrate-treating liquid supply unit shown in FIGS. 2 and 3.

FIG. 4 is a schematic diagram of an internal configuration of the circulation control module 230 constituting the substrate-treating liquid supply unit 150 shown in FIGS. 2 and 3. The following description refers to FIG. 4.

The pump 231 serves to pump the ink to move from the second reservoir 222 to the first reservoir 221. The pump 231 may be singly installed, but multiples of the pump 231 may be installed. When multiple pumps 231 are installed, they may be arranged in series or in parallel. Alternatively, the multiple pumps 231 may be in series and parallel arrangements combined.

The ink recovered to the second reservoir 222 through the second line 252 and the third line 253 may be re-supplied to the first reservoir 221 by the pump 231. In this case, to constantly maintain the differential pressure formed between the first reservoir 221 and the second reservoir 222, the pressure inputted to the pump 231 may be variable.

Figure 5:
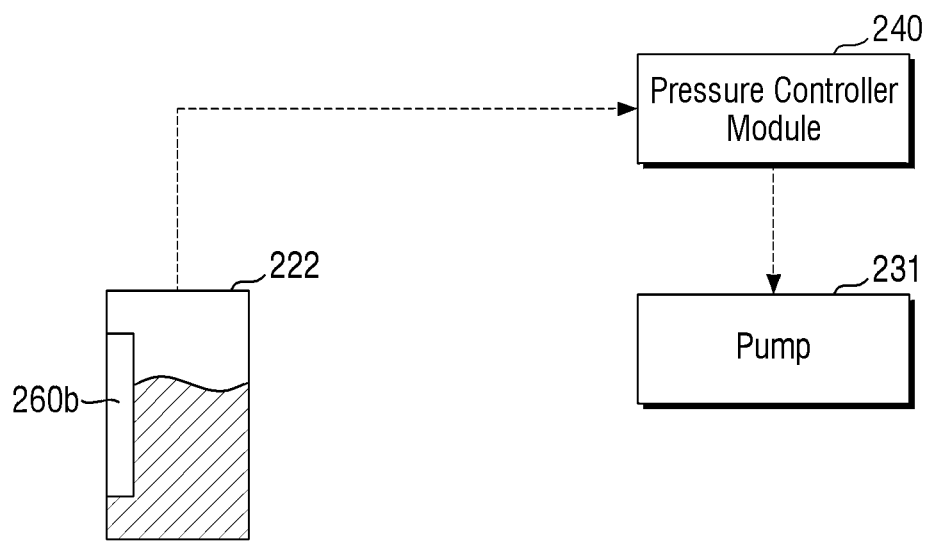
FIG. 5 is a first exemplary view for explaining a method of operating a pump constituting the circulation control module shown in FIG. 4.

The pressure of the pump 231 may be varied by measuring the water level information of the second reservoir 222 and receiving this level information as feedback. To measure the water level information of the second reservoir 222, as shown in FIG. 5, a water level measuring sensor 260*b* may be installed in the second reservoir 222. FIG. 5 is a first exemplary view for explaining a method of operating the pump constituting the circulation control module 230 shown in FIG. 4.

Figure 6:
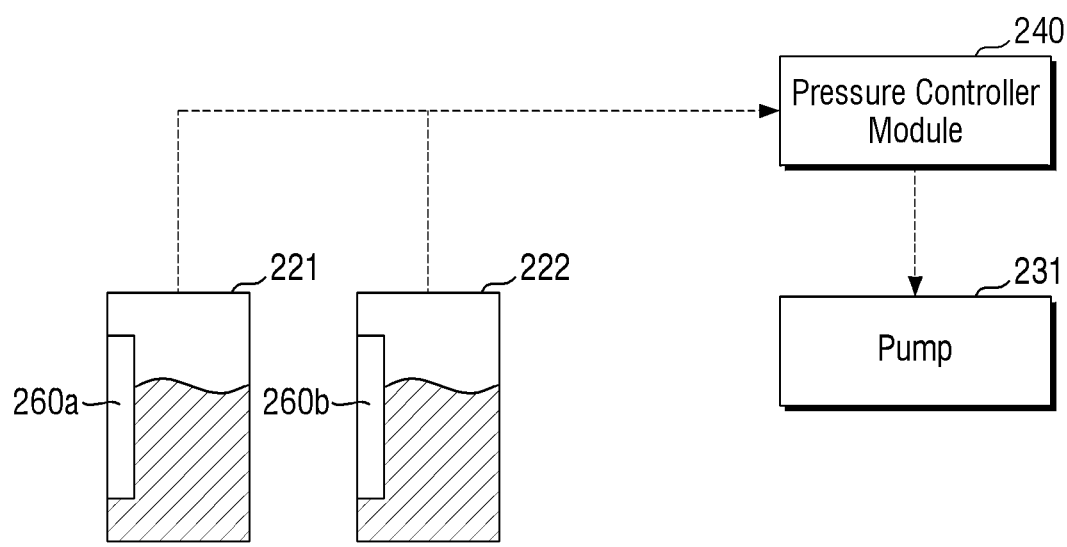
FIG. 6 is a second exemplary view for explaining a method of operating the pump constituting the circulation control module shown in FIG. 4.

Meanwhile, the pressure of the pump 231 may be variably controlled based on a ratio between the water level information of the first reservoir 221 and the water level information of the second reservoir 222. In this case, as shown in FIG. 6, a water level measuring sensor 260*a* may be installed in the first reservoir 221 as with the water level measuring sensor 260*b* installed in the second reservoir 222. FIG. 6 is a second exemplary view for explaining a method of operating the pump constituting the circulation control module 230 shown in FIG. 4.

The following description refers back to FIG. 4.

The flow meter 232 of the circulation control module 230 measures the flow rate of ink moving from the second reservoir 222 to the first reservoir 221. The flow meter 232 may be installed at the downstream end of the pump 231, that is, on a second pump line that is the tubing interconnecting the pump 231 and the first reservoir 221. The flow meter 232 may also be installed at the upstream end of the pump 231, that is, on a first pump line that is the tubing interconnecting the second reservoir 222 and the pump 231.

The filter 233 is adapted to filter the ink moving from the second reservoir 222 to the first reservoir 221. The filter 233 may also be installed at the downstream end of the pump 231 like the flow meter 232, and may also be installed at the upstream end of the pump 231.

Meanwhile, the filter 233 may be singly installed on the first pump line or the second pump line which is the tubing interconnecting the second reservoir 222 and the first reservoir 221, although multiples of the filter 233 may be installed. When multiples of the filter 233 are installed on the tubing interconnecting the second reservoir 222 and the first reservoir 221, the filters 233 may be disposed on the tubing in series or parallel. Alternatively, the multiple filters 233 may be disposed on the tubing in series and parallel arrangements combined.

The following description refers back to FIGS. 2 and 3.

The pressure controller module 240 controls the pressures of the first reservoir 221 and the second reservoir 222 constituting the supply reservoir module 220. The pressure controller module 240 may also control the pressure of the pump 231 constituting the circulation control module 230. The pressure controller module 240 may be implemented as, for example, a pressure controller module (PCM) including a pressure controller (PCON) board.

The pressure controller module 240 may independently control the respective pressures of the first reservoir 221 and the second reservoir 222. In this case, the pressure controller module 240 may be singly connected to the first reservoir 221 and the second reservoir 222 to independently control the respective pressures of the first reservoir 221 and the second reservoir 222. However, the present embodiment is not limited thereto. Two of the pressure controller module 240 may be respectively connected to the first reservoir 221 and the second reservoir 222 to independently control the respective pressures of the first reservoir 221 and the second reservoir 222.

The following describes a method of operating the substrate-treating liquid supply unit 150. A method of operating the substrate-treating liquid supply unit 150 to be described below relates to a method of maintaining a constant circulation flow rate between the supply reservoir module 220 thereof and the inkjet head unit 140.

Figure 7:
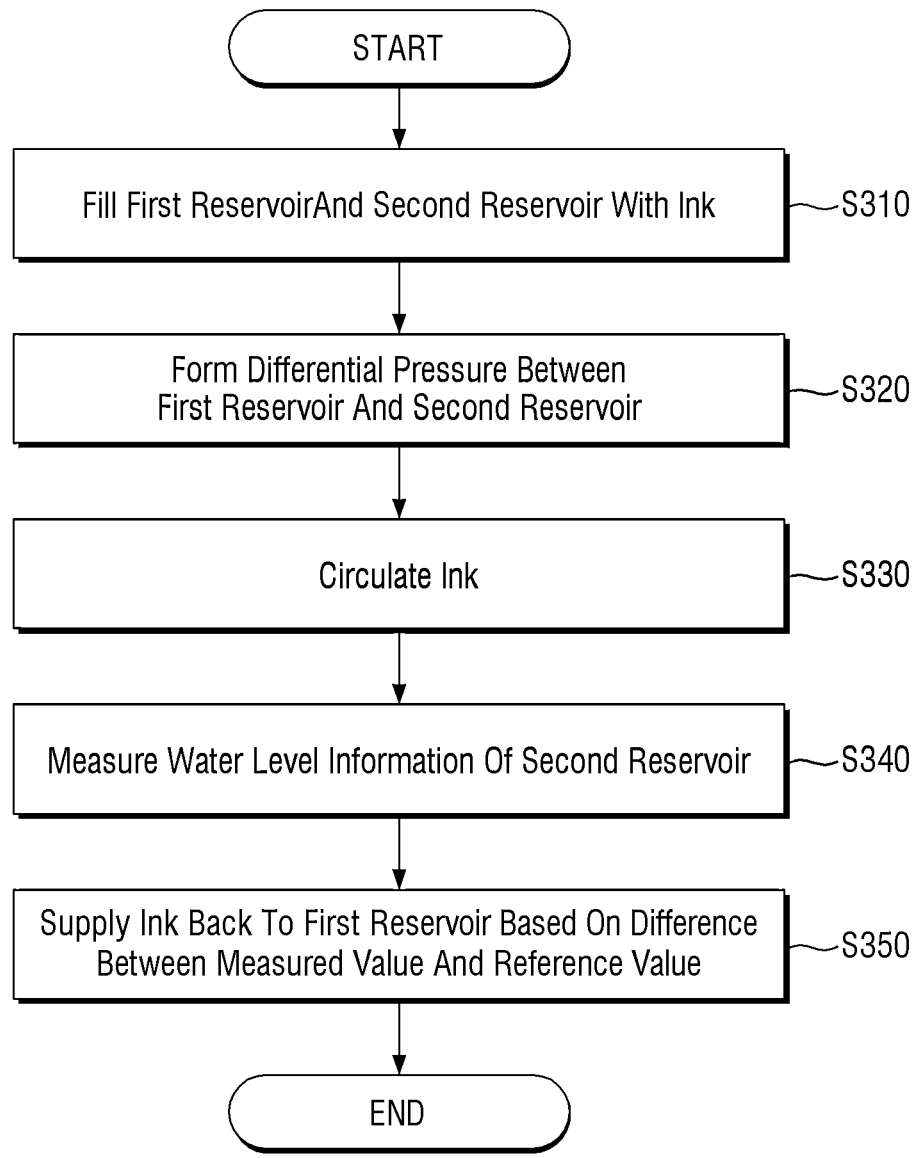
FIG. 7 is a flowchart sequentially illustrating a method of operating a substrate-treating liquid supply unit constituting a substrate-treating apparatus according to at least one embodiment of the present disclosure.

FIG. 7 is a flowchart sequentially illustrating a method of operating the substrate-treating liquid supply unit 150 constituting a substrate-treating apparatus according to at least one embodiment of the present disclosure. The following description refers to FIG. 7.

In the beginning, the first reservoir 221 and the second reservoir 222 are filled with ink up to a preset water level (S310).

Thereafter, the pressures in the first reservoir 221 and the second reservoir 222 are respectively set to preset negative pressure values to form a differential pressure therebetween (S320).

Then, the ink is circulated from the first reservoir 221 to the second reservoir 222 through the third line 253 as the main circulation path and the first line 251 and the second line 252 as the secondary circulation paths (S330).

Next, the water level information of the second reservoir 222 is measured, and the measured value is compared with a reference value which is a preset water level value (S340).

Subsequently, based on the difference between the measured water level value and the reference value, the pump 231 performs a preset operation to supply the ink back to the first reservoir 221 by the amount of ink overflowing to the second reservoir 222 (S350).

In the meantime, the control according to FIG. 7 may be constantly provided. Thereafter, the method may further include a filling step of replenishing the ink when the process runs outside of a predetermined range of the differential pressures between the first reservoir 221 and the second reservoir 222.

A substrate-treating apparatus and a method thereof, that is, an inkjet circulation system using pressure control and a method thereof, have been described above with reference to FIGS. 1 to 7. The present disclosure relates to inkjet circulation using pressure control. More particularly, it relates to an inkjet circulation system and method for circulating a substrate-treating liquid by forming a constant differential pressure between two reservoirs (the first reservoir 221 and the second reservoir 222).

The present disclosure may be composed of the two reservoirs 221 and 222, the inkjet head unit 140, the pump 231, the pressure controller module 240 for individual pressure control, and the like. Here, the constant differential pressure maintained between the two reservoirs 221 and 222 can form a flow rate of ink.

In the present disclosure, maintaining a low-flow rate circulation of the ink supplied to the inkjet head unit 140 while maintaining a high-flow rate circulation of the ink in an additional path other than the head supply path can prevent particle precipitation in the ink. This in turn prevents a defect in the discharge of the inkjet head unit 140 and prolongs the lifespan of the inkjet head unit 140.

According to the present disclosure, the optimal condition for forming the uniform differential pressure between the two reservoirs is the formation of a differential head of a chemical solution inside the two reservoirs, and individual pressure control allows the hydrostatic pressure to be uniformly controlled up to the nozzle faces of the head.

While some embodiments of the present disclosure have been particularly shown and described with reference to the accompanying drawings, it will be understood by those of ordinary skill in the art that various changes in form and details may be made therein without departing from the technical idea and scope of the present disclosure as defined by the following claims.

The invention claimed is:

1. A unit for supplying a substrate-treating liquid, the unit comprising:
 a supply reservoir module comprising:
  a first reservoir configured to supply the substrate-treating liquid to an inkjet head unit configured to jet the substrate-treating liquid onto a substrate, and
  a second reservoir configured to recover the substrate-treating liquid that remains unused in the inkjet head unit;
 a buffer reservoir module configured to provide the substrate-treating liquid to the first reservoir;
 a first line directly connecting the first reservoir and the second reservoir; and
 a circulation control module configured to circulate and re-supply the substrate-treating liquid from the second reservoir to the first reservoir,
 wherein a differential pressure is constantly maintained between the first reservoir and the second reservoir.

2. The unit of claim 1, further comprising:
 a second line connecting the first reservoir and the inkjet head unit;
 a third line connecting the inkjet head unit and the second reservoir.

3. The unit of claim 2, wherein the first line is configured to move a flow rate corresponding to the differential pressure between the first reservoir and the second reservoir.

4. The unit of claim 2, wherein a flow rate of the substrate-treating liquid passing through the first line is different from a flow rate of the substrate-treating liquid passing through the second line and/or the third line.

5. The unit of claim 4, wherein the flow rate of the substrate-treating liquid passing through the first line is greater than the flow rate of the substrate-treating liquid passing through the second line and/or the third line.

6. The unit of claim 2, wherein a flow rate of the substrate-treating liquid passing through the first line is variable.

7. The unit of claim 1, wherein the differential pressure comprises:
a differential head between the first reservoir and the second reservoir.

8. The unit of claim 1, wherein the differential pressure initially supplies the substrate-treating liquid to the first reservoir and the second reservoir and is followed by an application of negative pressure to form different pressures in the first reservoir and the second reservoir.

9. The unit of claim 1, wherein the first reservoir is provided at an even elevation with the second reservoir, and the buffer reservoir module is provided above the first reservoir and/or the second reservoir.

10. The unit of claim 1, wherein the circulation control module comprises:
a pump configured to circulate the substrate-treating liquid from the second reservoir to the first reservoir;
a flow meter configured to measure a flow rate of the substrate-treating liquid when circulated; and
a filter configured to filter the substrate-treating liquid when circulated.

11. The unit of claim 1, wherein the circulation control module is provided with a pressure that is variable.

12. The unit of claim 11, wherein the pressure provided to the circulation control module is variable based on water level information of the second reservoir, or is variable based on a ratio between water level information of the first reservoir and the water level information of the second reservoir.

13. The unit of claim 1, further comprising:
a water level measurement sensor configured to measure water level information, the water level measurement sensor being installed in the second reservoir, or installed in both the first reservoir and the second reservoir.

14. The unit of claim 1, further comprising:
a pressure controller module configured to independently control a pressure of the first reservoir and a pressure of the second reservoir.

15. A unit for supplying a substrate-treating liquid, the unit comprising:
a supply reservoir module comprising:
a first reservoir configured to supply the substrate-treating liquid to an inkjet head unit configured to jet the substrate-treating liquid onto a substrate, and
a second reservoir configured to recover the substrate-treating liquid that remains unused in the inkjet head unit;
a buffer reservoir module configured to provide the substrate-treating liquid to the first reservoir;
a circulation control module configured to cause the substrate-treating liquid recovered to the second reservoir to be circulated and re-supplied to the first reservoir;
a first line connecting the first reservoir and the inkjet head unit;
a second line connecting the inkjet head unit and the second reservoir; and
a third line connecting the first reservoir and the second reservoir,
wherein the third line is configured to move a flow rate corresponding to a differential pressure between the first reservoir and the second reservoir, and
wherein a flow rate of the substrate-treating liquid passing through the third line is greater than a flow rate of the substrate-treating liquid passing through the first line and/or the second line.

16. An apparatus for treating a substrate, comprising:
an inkjet head unit configured to jet a substrate-treating liquid onto the substrate; and
a unit for supplying the substrate-treating liquid to the inkjet head unit,
wherein the unit for supplying the substrate-treating liquid comprises:
a supply reservoir module comprising:
a first reservoir configured to supply the substrate-treating liquid to the inkjet head unit, and
a second reservoir configured to recover the substrate-treating liquid that remains unused in the inkjet head unit, and
a buffer reservoir module configured to provide the substrate-treating liquid to the first reservoir; and
a circulation control module configured to circulate and re-supply the substrate-treating liquid from the second reservoir to the first reservoir,
wherein a differential pressure is constantly maintained between the first reservoir and the second reservoir, and
wherein the unit for supplying the substrate-treating liquid further comprises:
a first line connecting the first reservoir and the inkjet head unit;
a second line connecting the inkjet head unit and the second reservoir;
a third line connecting the first reservoir and the second reservoir;
a fourth line separate from the second line and connected between the second reservoir and the circulation control module; and
a fifth line separate from the first line and connected between the circulation control module and the first reservoir.

17. The apparatus of claim 16, configured to utilize quantum dot (QD) ink for the substrate-treating liquid.

18. The apparatus of claim 16,
wherein the third line is configured to move a flow rate corresponding to the differential pressure between the first reservoir and the second reservoir.

19. The apparatus of claim 18, wherein a flow rate of the substrate-treating liquid passing through the third line is greater than a flow rate of the substrate-treating liquid passing through the first line and/or the second line.

* * * * *